(12) United States Patent
Tuttle et al.

(10) Patent No.: US 7,583,862 B2
(45) Date of Patent: Sep. 1, 2009

(54) PACKAGED MICROELECTRONIC IMAGERS AND METHODS OF PACKAGING MICROELECTRONIC IMAGERS

(75) Inventors: Mark E. Tuttle, Boise, ID (US); William M. Hiatt, Eagle, ID (US)

(73) Assignee: Aptina Imaging Corporation, Grand Cayman (KY)

( * ) Notice: Subject to any disclaimer, the term of this patent is extended or adjusted under 35 U.S.C. 154(b) by 1009 days.

(21) Appl. No.: 10/723,363

(22) Filed: Nov. 26, 2003

(65) Prior Publication Data

US 2005/0110889 A1    May 26, 2005

(51) Int. Cl.
G06K 7/00 (2006.01)
G06K 9/20 (2006.01)
H04N 3/14 (2006.01)
H04N 5/335 (2006.01)
H01L 21/00 (2006.01)

(52) U.S. Cl. .................. 382/312; 348/294; 348/340; 438/26; 257/433

(58) Field of Classification Search ................ 382/294, 382/312; 348/340, 294; 438/26; 257/433
See application file for complete search history.

(56) References Cited

U.S. PATENT DOCUMENTS

| 3,345,134 | A |   | 10/1967 | Heymer et al. |
|---|---|---|---|---|
| 4,534,100 | A |   | 8/1985 | Lane |
| 4,906,314 | A |   | 3/1990 | Farnworth et al. |
| 5,130,783 | A |   | 7/1992 | McLellan |
| 5,341,213 | A | * | 8/1994 | Giroux ................ 356/509 |
| 5,371,397 | A |   | 12/1994 | Maegawa et al. |
| 5,424,573 | A |   | 6/1995 | Kato et al. |
| 5,435,887 | A |   | 7/1995 | Rothschild et al. |
| 5,505,804 | A |   | 4/1996 | Mizuguchi et al. |
| 5,593,913 | A |   | 1/1997 | Aoki |
| 5,605,783 | A |   | 2/1997 | Revelli et al. |
| 5,672,519 | A |   | 9/1997 | Song et al. |
| 5,694,246 | A |   | 12/1997 | Aoyama et al. |
| 5,708,293 | A |   | 1/1998 | Ochi et al. |
| 5,771,158 | A |   | 6/1998 | Yamagishi et al. |
| 5,776,824 | A |   | 7/1998 | Farnworth et al. |

(Continued)

FOREIGN PATENT DOCUMENTS

EP    0 886 323    12/1998

(Continued)

OTHER PUBLICATIONS

PCT International Search Report dated May 31, 2005 for PCT/US2004/038101 filed Nov. 12, 2004 (4 pages).

(Continued)

*Primary Examiner*—John B Strege
(74) *Attorney, Agent, or Firm*—Dickstein Shapiro LLP

(57) ABSTRACT

A microelectronic imager having an imaging unit and an optics unit attached to the imaging unit, and methods for packaging microelectronic imagers. In one embodiment, the imaging unit can include a microelectronic die with an image sensor and a plurality of external contacts electrically coupled to the image sensor and a first referencing element fixed to the imaging unit. The optics unit can include an optic member and a second referencing element fixed to the optics unit. The second referencing element is seated with the first referencing element at a fixed, preset position in which the optic member is situated at a desired location relative to the image sensor.

18 Claims, 9 Drawing Sheets

U.S. PATENT DOCUMENTS

| | | |
|---|---|---|
| 5,811,799 A | 9/1998 | Wu |
| 5,821,532 A | 10/1998 | Beaman et al. |
| 5,857,963 A | 1/1999 | Pelchy et al. |
| 5,861,654 A * | 1/1999 | Johnson ............... 257/433 |
| 5,877,040 A | 3/1999 | Park et al. |
| 5,897,338 A | 4/1999 | Kaldenberg |
| 5,914,488 A | 6/1999 | Sone |
| 5,977,535 A | 11/1999 | Rostoker |
| 5,998,862 A | 12/1999 | Yamanaka |
| 6,080,291 A | 6/2000 | Woodruff et al. |
| 6,104,086 A | 8/2000 | Ichikawa et al. |
| 6,114,240 A | 9/2000 | Akram et al. |
| 6,143,588 A | 11/2000 | Glenn |
| 6,236,046 B1 | 5/2001 | Watabe et al. |
| 6,259,083 B1 | 7/2001 | Kimura |
| 6,266,197 B1 | 7/2001 | Glenn et al. |
| 6,274,927 B1 | 8/2001 | Glenn |
| 6,285,064 B1 | 9/2001 | Foster |
| 6,351,027 B1 | 2/2002 | Giboney et al. |
| 6,372,548 B2 | 4/2002 | Bessho et al. |
| 6,407,381 B1 | 6/2002 | Glenn et al. |
| 6,411,439 B2 | 6/2002 | Nishikawa |
| 6,483,652 B2 | 11/2002 | Nakamura |
| 6,503,780 B1 | 1/2003 | Glenn et al. |
| 6,541,762 B2 | 4/2003 | Kang et al. |
| 6,560,047 B2 | 5/2003 | Choi et al. |
| 6,566,745 B1 | 5/2003 | Beyne et al. |
| 6,603,183 B1 | 8/2003 | Hoffman |
| 6,617,623 B2 | 9/2003 | Rhodes |
| 6,621,522 B1 * | 9/2003 | Chang et al. ............. 348/374 |
| 6,661,047 B2 | 12/2003 | Rhodes |
| 6,667,551 B2 | 12/2003 | Hanaoka et al. |
| 6,670,986 B1 | 12/2003 | Ben Shoshan et al. |
| 6,686,588 B1 | 2/2004 | Webster et al. |
| 6,703,310 B2 | 3/2004 | Mashino et al. |
| 6,864,172 B2 | 4/2004 | Noma et al. |
| 6,734,419 B1 | 5/2004 | Glenn et al. |
| 6,759,266 B1 | 7/2004 | Hoffman |
| 6,774,486 B2 | 8/2004 | Kinsman |
| 6,778,046 B2 | 8/2004 | Stafford et al. |
| 6,783,286 B2 | 8/2004 | Maeda et al. |
| 6,791,076 B2 | 9/2004 | Webster |
| 6,795,120 B2 | 9/2004 | Takagi et al. |
| 6,797,616 B2 | 9/2004 | Kinsman |
| 6,800,943 B2 | 10/2004 | Adachi |
| 6,813,154 B2 | 11/2004 | Diaz et al. |
| 6,825,458 B1 | 11/2004 | Moess et al. |
| 6,828,663 B2 | 12/2004 | Chen et al. |
| 6,828,674 B2 | 12/2004 | Karpman |
| 6,844,978 B2 | 1/2005 | Harden et al. |
| 6,882,021 B2 | 4/2005 | Boon et al. |
| 6,885,107 B2 | 4/2005 | Kinsman |
| 6,934,065 B2 | 8/2005 | Kinsman |
| 6,946,325 B2 | 9/2005 | Yean et al. |
| 2002/0006687 A1 | 1/2002 | Lam |
| 2002/0057468 A1 * | 5/2002 | Segawa et al. ............. 358/509 |
| 2002/0089025 A1 | 7/2002 | Chou |
| 2002/0096729 A1 | 7/2002 | Tu et al. |
| 2002/0113296 A1 | 8/2002 | Cho et al. |
| 2002/0140836 A1 * | 10/2002 | Miyake et al. ............. 348/340 |
| 2002/0145676 A1 * | 10/2002 | Kuno et al. ............... 348/340 |
| 2003/0062601 A1 | 4/2003 | Harnden et al. |
| 2003/0223008 A1 * | 12/2003 | Kim et al. ................. 348/340 |
| 2004/0012698 A1 | 1/2004 | Suda et al. |
| 2004/0023469 A1 | 2/2004 | Suda |
| 2004/0038442 A1 | 2/2004 | Kinsman |
| 2004/0041261 A1 | 3/2004 | Kinsman |
| 2004/0082094 A1 | 4/2004 | Yamamoto |
| 2004/0214373 A1 | 10/2004 | Jiang et al. |
| 2004/0245649 A1 | 12/2004 | Imaoka |
| 2005/0052751 A1 | 3/2005 | Liu et al. |
| 2005/0104228 A1 | 5/2005 | Rigg et al. |
| 2005/0110889 A1 | 5/2005 | Tuttle et al. |
| 2005/0127478 A1 | 6/2005 | Hiatt et al. |
| 2005/0151228 A1 | 7/2005 | Tanida et al. |
| 2005/0236708 A1 | 10/2005 | Farnworth et al. |
| 2005/0254133 A1 | 11/2005 | Akram et al. |

FOREIGN PATENT DOCUMENTS

| | | |
|---|---|---|
| EP | 1 157 967 A2 | 11/2001 |
| FR | 2835654 A1 | 8/2003 |
| JP | 59101882 A | 6/1984 |
| JP | 59-191388 | 10/1984 |
| JP | 07-263607 A | 10/1995 |
| JP | 2001-077496 A | 3/2001 |
| WO | WO-90/05424 A1 | 5/1990 |
| WO | W0-02/075815 A1 | 9/2002 |
| WO | WO-02/095796 A2 | 11/2002 |
| WO | WO-02/095796 A3 | 11/2002 |
| WO | WO-2004/054001 A2 | 6/2004 |

OTHER PUBLICATIONS

PCT Written Opinion dated May 31, 2005 for PCT/US2004/038101 filed Nov. 12, 2004 (6 pages).
U.S. Appl. No. 10/785,466, Kirby.
U.S. Appl. No. 10/845,304, Jiang et al.
U.S. Appl. No. 10/857,948, Boettiger et al.
U.S. Appl. No. 10/863,994, Akram et al.
U.S. Appl. No. 10/864,974, Kirby et al.
U.S. Appl. No. 10/867,352, Farnworth et al.
U.S. Appl. No. 10/867,505, Farnworth et al.
U.S. Appl. No. 10/879,398, Akram et al.
U.S. Appl. No. 10/879,838, Kirby et al.
U.S. Appl. No. 10/893,022, Hall et al.
U.S. Appl. No. 10/894,262, Farnworth et al.
U.S. Appl. No. 10/901,851, Derderian et al.
U.S. Appl. No. 10/910,491, Bolken et al.
U.S. Appl. No. 10/915,180, Street et al.
U.S. Appl. No. 10/919,604, Farnworth et al.
U.S. Appl. No. 10/922,177, Oliver et al.
U.S. Appl. No. 10/922,192, Farnworth.
U.S. Appl. No. 10/925,406, Oliver.
U.S. Appl. No. 10/925,501, Oliver.
U.S. Appl. No. 10/925,502, Watkings et al.
U.S. Appl. No. 10/927,550, Derderian et al.
U.S. Appl. No. 10/927,760 Chong et al.
U.S. Appl. No. 10/928,598, Kirby.
U.S. Appl. No. 10/932,296, Oliver et al.
U.S. Appl. No. 11/027,443, Kirby.
U.S. Appl. No. 11/054,692 Boemler.
U.S. Appl. No. 11/056,211, Hembree et al.
U.S. Appl. No. 11/056,484 Boettiger et al.
U.S. Appl. No. 11/061,034 Boettiger.
U.S. Appl. No. 11/146,783, Tuttle et al.
U.S. Appl. No. 11/169,546, Sulfridge.
U.S. Appl. No. 11/169,838, Sulfridge.
U.S. Appl. No. 11/177,905, Akram.
U.S. Appl. No. 11/209,524, Akram.
U.S. Appl. No. 11/217,169, Hiatt et al.
U.S. Appl. No. 11/217,877, Oliver et al.
U.S. Appl. No. 11/218,126, Farnworth et al.
U.S. Appl. No. 11/218,243, Kirby et al.
Aachboun, S. and P. Ranson, "Cryogenic etching of deep narrow trenches in silicon," J. Vac. Sci. Technol. A 18(4), Jul./Aug. 2000, pp. 1848-1852.
Aachboun, S. and P. Ranson, "Deep anisotropic etching of silicon," J. Vac. Sci. Technol. A 17(4), Jul./Aug. 1999, pp. 2270-2273.
Austin, M.D. and S.Y. Chou, "Fabrication of 70 nm channel length polymer organic thin-film transistors using nanoimprint lithography," Applied Physics Letters, vol. 81, No. 23, pp. 4431-4433, Dec. 2, 2002, American Institute of Physics.

Blackburn, J.M. et al., "Deposition of Conformal Copper and Nickel Films from Supercritical Carbon Dioxide," Science, vol. 294, pp. 141-145, Oct. 5, 2001.

Brubaker, C. et al., "Ultra-thick Lithography for Advanced Packaging and MEMS," SPIE's 27th Annual International Symposium on Microlithography 2002, Mar. 3-8, 2002, Santa Clara, CA.

Cheng, Yu-T. et al., "Vacuum Packaging Technology Using Localized Aluminum/Silicon-to-Glass Bonding," Journal of Microelectromechanical Systems, vol. 11, No. 5, pp. 556-565, Oct. 2002.

DuPont Electronic Materials, Data Sheet, Pyralux PC 2000 Flexible Composites, 4 pages, Oct. 1998, <http://www.dupont.com/fcm>.

Edmund Industrial Optics, Mounted IR Filters, 1 page, retrieved from the Internet on Jun. 30, 2003, <http://www.edmundoptics.com>.

Hamdorf, M. et al. "Surface-rheological measurements on glass forming polymers based on the surface tension driven decay of imprinted corrugation gratings," Journal of Chemical Physics, vol. 112, No. 9, pp. 4262-4270, Mar. 1, 2000, American Institute of Physics.

Hirafune, S. et al., "Packaging Technology for Imager Using Through-hole Interconnection in Si Substrate," Proceeding of HDP'04, IEEE, pp. 303-306, Jul. 2004.

IBM, Zurich Research Laboratory, EPON SU-8 photoresist, 1 page, retrieved from the Internet on Jan. 21, 2003, <http://www.zurich.ibm.com/st/mems/su8.html>.

Intrinsic Viscosity and Its Relation to Intrinsic Conductivity, 9 pages, retrieved from the Internet on Oct. 30, 2003, <http://www.ciks.cbt.nist.gov/~garbocz/paper58/node3.html>.

King, B. et al. Optomec, Inc., M3D™ Technology, Maskless Mesoscale™ Materials Deposition, 5 pages, <http://www.optomec.com/downloads/M3D%20White%Paper%20080502.pdf>, retrieved from the Internet on Jun. 17, 2005.

Kingpak Technology, Inc. "CMOS Image Sensor Packaging," 1 page, retrieved from the Internet on Aug. 26, 2003, <http://www.kingpak.com/CMOSImager.html>.

Kramer, S.J. et al., "Annual Report—Applications of Supercritical Fluid Technology to Semiconductor Device Processing," pp. 1-29, Nov. 2001.

Kyocera Corporation, Memory Package, 1 page, retrieved from the Internet on Dec. 3, 2004, <http://global.kyocera.com/prdct/semicon/ic_pkg/memory_p.html>.

Lin, Tim (Zhigang) and Rick Yoon, "One Package Technique of Exposed MEMS Sensors," pp. 105-108, 2002 International Symposium on Microelectonics, Sep. 2002.

Ma, X. et al., "Low Temperature Bonding for Wafer Scale Packaging and Assembly of Micromachined Sensors," Final Report 1998-1999 for MICRO Project 98-144, 3 pages, Department of Electrical & Computer Engineering, Univeristy of California, Davis.

Micro Chem, Nano SU-8, Negative Tone Photoresist Formulations 50-100, 4 pages, Feb. 2002, <http://www.microchem.com/products/pdf/SU8_50-100.pdf>.

Optomec, Inc., M3D™ Technology, Maskless Mesoscale Materials Deposition (M3D), 1 page, <http://www.optomec.com/html/m3d.htm>, retrieved from the Internet on Aug. 15, 2003.

Optomec, Inc., M3D™, Maskless Mesoscale™ Materials Deposition, 2 pages, <http://www.optomec.com/downloads/M3DSheet.pdf>, retrieved from the Internet on Jun. 17, 2005.

Photo Vision Systems, Inc., "Advances in Digital Image Sensors," 22 pages, First Annual New York State Conference on Microelectronic Design, Jan. 12, 2002.

Shen, X.-J. et al., "Microplastic embossing process: experimental and theoretical characterizations," Sensors and Actuators, A 97-98 (2002) pp. 428-433, Elsevier Science B.V.

Tapes II International Tape and Fabrication Company, Electronics and Electrical Tapes, 2 pages, 2003, <http://www.tapes2.com/electronics.htm>.

TransChip, 1 page, retrieved from the Internet on Aug. 26, 2003, <http://www.missionventures.com/portfolio/companies/transchip.html>.

TransChip, Inc., CMOS vs CCD, 3 pages, retrieved from the Internet on Dec. 14, 2005, <http://www.transchip.com/content.aspx?id=127>.

TransChip, Inc., Technology, 3 pages, retrieved from the Internet on Dec. 14, 2005, <http://www.transchip.com/content.aspx?id=10 >.

UCI Integrated Nanosystems Research Facility, "Cleaning procedures for glass substrates," 3 pages, Fall 1999.

UCI Integrated Nanosystems Research Facility, "Glass Etch Wet Process," 3 pages, Summer 2000.

Walker, M.J., "Comparison of Bosch and cryogenic processes for patterning high aspect ratio features in silicon," 11 pages, Proc. SPIE vol. 4407, p. 89-99, MEMS Design, Fabrication Characterization, and Packaging, Uwe F. Behringer; Deepak G. Uttamchandani; Eds., Apr. 2001.

Xsil, Via Applications, 1 page, <http://www.xsil.com/viaapplications/index.htm>, retrieved from the Internet on Jul. 22, 2003.

Xsil, Vias for 3D Packaging, 1 page, <http://www.xsil.com/viaapplications/3dpackaging/index.htm>, retrieved from the Internet on Jul. 22, 2003.

Ye, X.R. et al., "Immersion Deposition of Metal Films on Silicon and Germanium Substrates in Supercritical Carbon Dioxide," Chem. Mater. 2003, 15, 83-91.

Yoshida, J. "TransChip rolls out a single-chip CMOS imager," 3 pages, EE Times, Jul. 18, 2003.

* cited by examiner

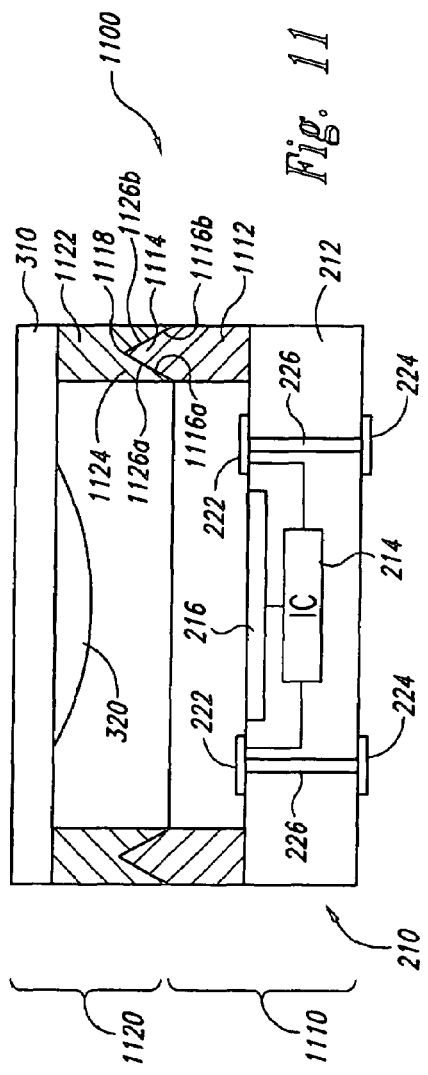
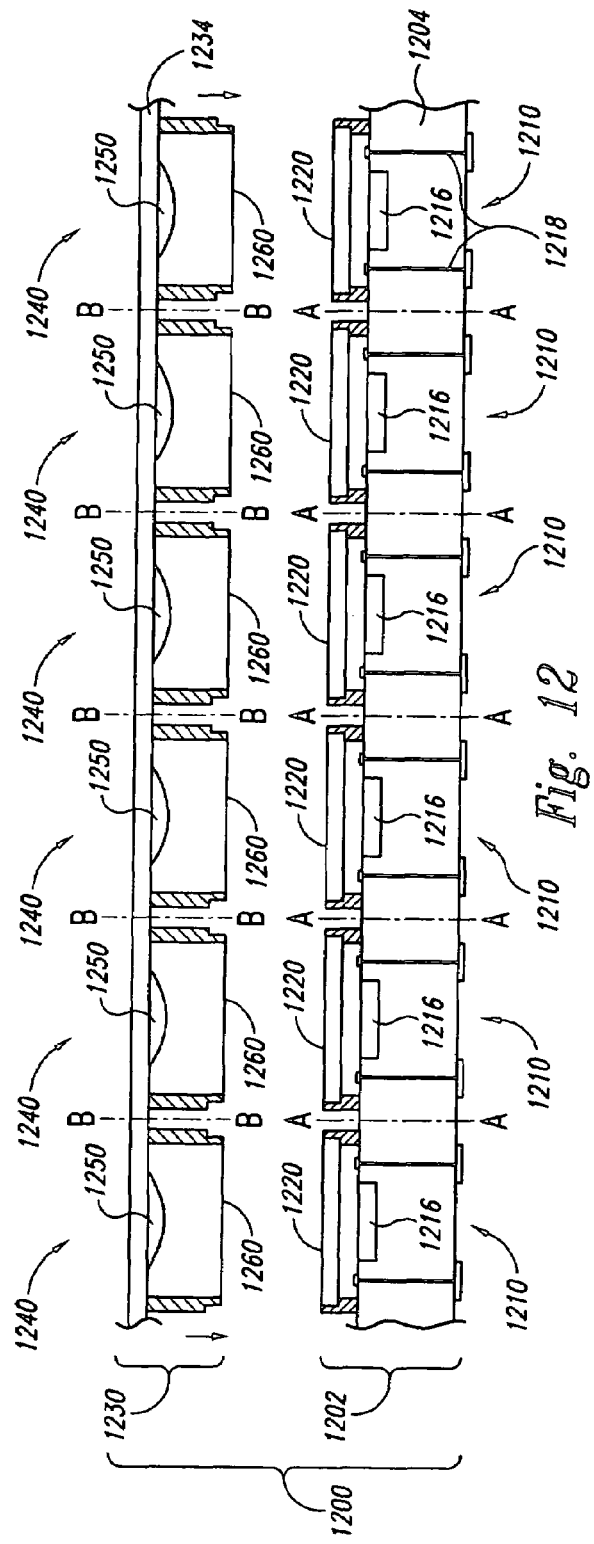

PACKAGED MICROELECTRONIC IMAGERS AND METHODS OF PACKAGING MICROELECTRONIC IMAGERS

TECHNICAL FIELD

The present invention is related to microelectronic devices and methods for packaging microelectronic devices. Several aspects of the present invention are directed toward packaging microelectronic imagers that are responsive to radiation in the visible light spectrum or radiation in other spectrums.

BACKGROUND

Microelectronic imagers are used in digital cameras, wireless devices with picture capabilities, and many other applications. Cell phones and Personal Digital Assistants (PDAs), for example, are incorporating microelectronic imagers for capturing and sending pictures. The growth rate of microelectronic imagers has been steadily increasing as they become smaller and produce better images with higher pixel counts.

Microelectronic imagers include image sensors that use Charged Coupled Device (CCD) systems, Complementary Metal-Oxide Semiconductor (CMOS) systems, or other systems. CCD image sensors have been widely used in digital cameras and other applications. CMOS image sensors are also quickly becoming very popular because they are expected to have low production costs, high yields and small sizes. CMOS image sensors can provide these advantages because they are manufactured using technology and equipment developed for fabricating semiconductor devices. CMOS image sensors, as well as CCD image sensors, are accordingly "packaged" to protect the delicate components and to provide external electrical contacts.

FIG. 1 is a schematic view of a conventional microelectronic imager 1 with a conventional package. The imager 1 includes a die 10, an interposer substrate 20 attached to the die 10, and a housing 30 attached to the interposer substrate 20. The housing 30 surrounds the periphery of the die 10 and has an opening 32. The imager 1 also includes a transparent cover 40 over the die 10.

The die 10 includes an image sensor 12 and a plurality of bond-pads 14 electrically coupled to the image sensor 12. The interposer substrate 20 is typically a dielectric fixture having a plurality of bond-pads 22, a plurality of ball-pads 24, and traces 26 electrically coupling bond-pads 22 to corresponding ball-pads 24. The ball-pads 24 are arranged in an array for surface mounting the imager 1 to a board or module of another device. The bond-pads 14 on the die 10 are electrically coupled to the bond-pads 22 on the interposer substrate 20 by wire-bonds 28 to provide electrical pathways between the bond-pads 14 and the ball-pads 24.

The imager 1 shown in FIG. 1 also has an optics unit including a support 50 attached to the housing 30 and a barrel 60 adjustably attached to the support 50. The support 50 can include internal threads 52, and the barrel 60 can include external threads 62 engaged with the threads 52. The optics unit also includes a lens 70 carried by the barrel 60.

One problem with packaging conventional microelectronic imagers is that it is difficult to accurately align the lens with the image sensor. Referring to FIG. 1, the centerline of the lens 70 should be aligned with the centerline of the image sensor 12 within very tight tolerances. For example, as microelectronic imagers have higher pixel counts and smaller sizes, the centerline of the lens 70 is often required to be within 50 µm of the centerline of the image sensor 12. This is difficult to achieve with conventional imagers because the support 50 may not be positioned accurately on the housing 30, and the barrel 60 is manually threaded onto the support 50. Therefore, there is a need to align lenses with image sensors with greater precision in more sophisticated generations of microelectronic imagers.

Another problem of packaging conventional microelectronic imagers is that positioning the lens at a desired focus distance from the image sensor is time-consuming and may be inaccurate. The lens 70 shown in FIG. 1 is spaced apart from the image sensor 12 at a desired distance by rotating the barrel 60 (arrow R) to adjust the elevation (arrow E) of the lens 70 relative to the image sensor 12. In practice, an operator rotates the barrel 60 by hand while watching an output of the imager 1 on a display until the picture is focused based on the operator's subjective evaluation. The operator then adheres the barrel 60 to the support 50 to secure the lens 70 in a position where it is spaced apart from the image sensor 12 by a suitable focus distance. This process is problematic because it is exceptionally time-consuming and subject to operator errors.

Yet another concern of conventional microelectronic imagers is that they have relatively large footprints and occupy a significant amount of vertical space (i.e., high profiles). The footprint of the imager in FIG. 1 is the surface area of the bottom of the interposer substrate 20. This is typically much larger than the surface area of the die 10 and can be a limiting factor in the design and marketability of picture cell phones or PDAs because these devices are continually shrinking to be more portable. Therefore, there is a need to provide microelectronic imagers with smaller footprints and lower profiles.

Yet another concern of conventional microelectronic imagers is the manufacturing costs for packaging the dies. The imager 1 shown in FIG. 1 is relatively expensive because manually adjusting the lens 70 relative to the image sensor 12 is very inefficient and subject to error. Moreover, the support 50 and barrel 60 are assembled separately for each die 10 individually after the dies have been singulated from a wafer and attached to the interposer substrate 20. Therefore, there is a significant need to enhance the efficiency, reliability and precision of packaging microelectronic imagers.

BRIEF DESCRIPTION OF THE DRAWINGS

FIG. 11 is a side cross-sectional view of a microelectronic imager in accordance with another embodiment of the invention.

FIG. 12 is a side cross-sectional view of an assembly including a microelectronic workpiece having a plurality of imaging units and an optics workpiece having a plurality of optics units in accordance with an embodiment of the invention.

DETAILED DESCRIPTION

A. Overview

Figure 1:
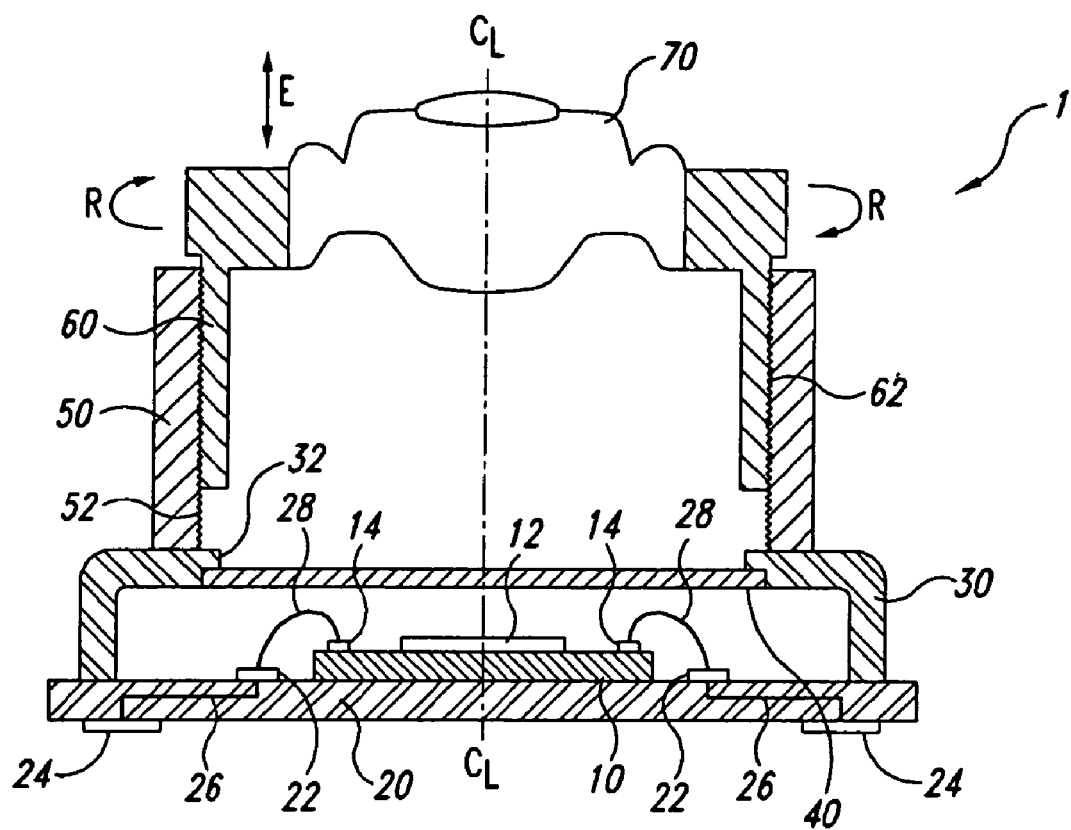
FIG. 1 is a cross-sectional view of a packaged microelectronic imager in accordance with the prior art.

The following disclosure describes several embodiments of microelectronic imagers and methods for packaging microelectronic imagers. The microelectronic imagers accurately align a lens or other type of optic member with an image sensor on a die and/or accurately position the optic member at a desired distance from the image sensor. In addition to these aspects regarding the individual microelectronic imagers, many embodiments of the methods for packaging microelectronic imagers are directed toward providing wafer-level processes for forming referencing elements that reliably align the optic member with the image sensor and space the optic member apart from the image sensor by a desired distance with a high degree of precision using automated equipment. Several embodiments of microelectronic imagers and methods for packaging microelectronic imagers in accordance with the invention, therefore, are expected to significantly reduce the time for assembling microelectronic imagers and increase the accuracy with which an optic member is positioned at a desired location relative to a corresponding image sensor.

One particular embodiment of the invention is directed toward a microelectronic imager comprising an imaging unit and an optics unit attached to the imaging unit. The imaging unit can include (a) a microelectronic die with an image sensor and a plurality of external contacts electrically coupled to the image sensor and (b) a first referencing element fixed to the imaging unit. The optics unit can include an optic member and a second referencing element fixed to the optics unit. The second referencing element is seated with the first referencing element at a fixed, preset position in which the optic member is situated at a desired location relative to the image sensor. The first and second referencing elements, for example, can be keyed together in an interlocked configuration.

The first and second referencing elements can have several different configurations. In one embodiment, for example, the first referencing element has a first interface feature at a first reference location relative to the image sensor on the die, and the second referencing element has a second interface feature at a second reference location relative to the optic member. The first interface feature engages the second interface feature such that the first reference location coincides with the second reference location when the optic member is aligned with the image sensor and spaced apart from the image sensor at a predetermined location. The first and second referencing elements can be configured to mate or otherwise engage each other in only a single configuration in which the centerline of the optic member is aligned with the centerline of the image sensor and/or the optic member is at a desired focus distance from the image sensor.

In another embodiment of the invention, a microelectronic imager comprises a microelectronic die having an image sensor, a plurality of contacts electrically coupled to the image sensor, and a first referencing element fixed relative to the die. The first referencing element can have a first alignment component at a predetermined lateral distance from the image sensor and a first stop component spaced apart from the image sensor along an axis normal to the image sensor by a predetermined separation distance. The microelectronic imager can further include an optics unit having an optic member and a second referencing element connected to the optics unit. The second referencing element can have a second alignment component engaged with the first alignment component of the first referencing element to align the optic member with the image sensor. The second referencing element can further include a second stop component engaged with the first stop component of the first referencing element to space the optic member apart from the image sensor by a desired distance (e.g., the desired focus distance).

Several embodiments of methods in accordance with the invention involve using wafer-level processes to (a) form the referencing elements and/or (b) assemble the imaging units with the optics units. For example, a microelectronic workpiece can comprise a first substrate and a plurality of imaging units on the first substrate. The imaging units can each have a die on the first substrate and a first referencing element fixed relative to the die. The individual dies can include an image sensor and external electrical contacts electrically coupled to the image sensor. The first referencing element at each die has an alignment component at a predetermined lateral distance from the image sensor and a stop component at a predetermined elevation with respect to the image sensor. The individual first referencing elements can be formed directly on the workpiece or on covers over the dies before singulating the workpiece to separate the imaging units from each other. Therefore, the microelectronic workpiece can include a plurality of discrete first referencing elements associated with corresponding dies that are configured to receive second referencing elements of individual optics units to position individual optic members at a desired location relative to corresponding image sensors.

Further aspects of the invention are directed toward an optics workpiece having a plurality of optics units. The individual optics units can each include an optic member and a second referencing element. Still further aspects of the invention are directed toward a wafer-level assembly having a microelectronic workpiece with a plurality of imaging units and a plurality of optics units attached to corresponding imaging units before singulating the microelectronic workpiece.

Specific details of several embodiments of the invention are described below with reference to CMOS imagers to provide a thorough understanding of these embodiments, but other embodiments can be CCD imagers or other types of imagers. Several details describing well-known structures often associated with microelectronic devices are not set forth in the following description to avoid unnecessarily obscuring the description of the disclosed embodiments. Additionally, several other embodiments of the invention can have different configurations or components than those described in this section. As such, a person of ordinary skill in the art will accordingly understand that the invention may have other embodiments with additional elements or without several of the elements shown and described below with reference to FIGS. 2A-12.

B. Embodiments of Microelectronic Imagers

Figure 2A:
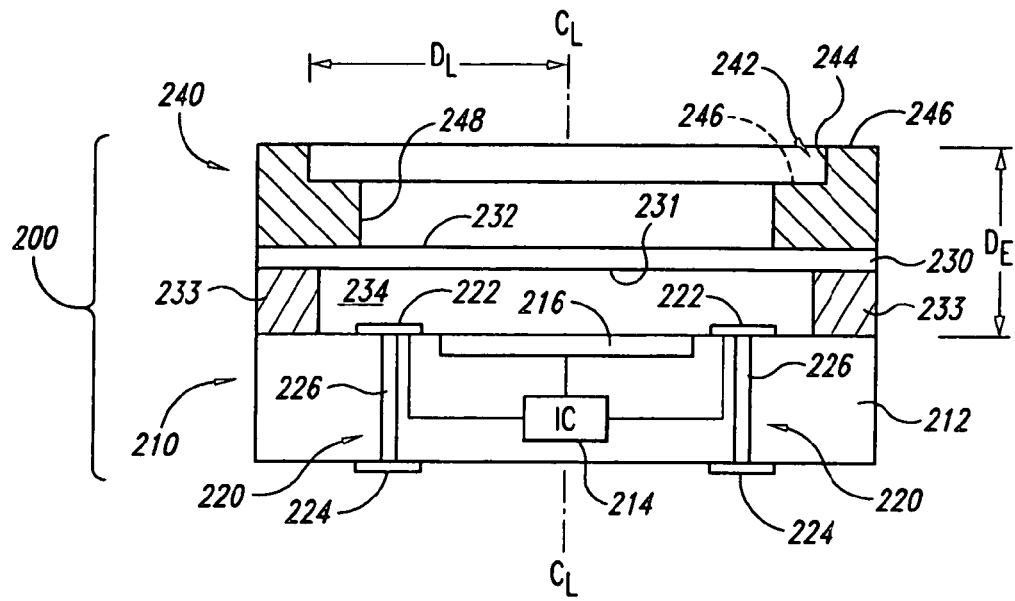
FIG. 2A is a side cross-sectional view and FIG. 2B is a top plan view of an imaging unit for a microelectronic imager in accordance with an embodiment of the invention.

FIG. 2A is a side cross-sectional view of an imaging unit 200 for use in a microelectronic imager in accordance with one embodiment of the invention. Several features of the imaging unit 200 illustrated in FIG. 2A and other imaging units illustrated in later figures are shown schematically without cross-hatching. In this embodiment, the imaging unit 200 includes a die 210 having a substrate 212, integrated circuitry (IC) 214 integrated with the substrate 212, and an image sensor 216 operatively coupled to the IC 214. The image sensor 216 can be a CMOS device or a CCD for capturing pictures or other images in the visible spectrum. In other embodiments, the image sensor 216 can detect radiation in other spectrums (e.g., IR or UV ranges).

The imaging unit 200 further includes a plurality of external contacts 220 for carrying signals. The embodiment of the external contacts 220 shown in FIG. 2A provides a small array of ball-pads within the footprint of the die 210. Each external contact 220, for example, can include a bond-pad 222, a ball-pad 224, and a through-wafer interconnect 226 coupling the bond-pad 222 to the ball-pad 224. The through-wafer interconnects 226 can be formed according to the processes disclosed in U.S. Application No. entitled Microelectronic Devices, Methods for Forming Vias in Microelectronic Devices, and. Methods for Packaging Microelectronic Devices, filed on Nov. 13, 2003 (Perkins Coie Docket No. 10829.8742US00), which is incorporated by reference herein. Other embodiments of external contacts can include contacts having traces that wrap around the side of the substrate 212.

The imaging unit 200 can further include a cover 230 having a first side 231 facing generally toward the image sensor 216 and a second side 232 facing away from the image sensor 216. The cover 230 is mounted to a spacer 233 that circumscribes the image sensor 216. The cover 230 and the spacer 233 form an enclosure 234 for protecting the image sensor 216. The cover 230 can be glass, quartz, or other materials transmissive to a desired spectrum of radiation. In embodiments directed toward imaging radiation in the visible spectrum, the protective cover 230 can also filter infrared radiation or other undesirable spectrums of radiation. The protective cover 230, for example, can be formed from a material and/or can have a coating that filters IR or near IR spectrums.

Figure 2B:
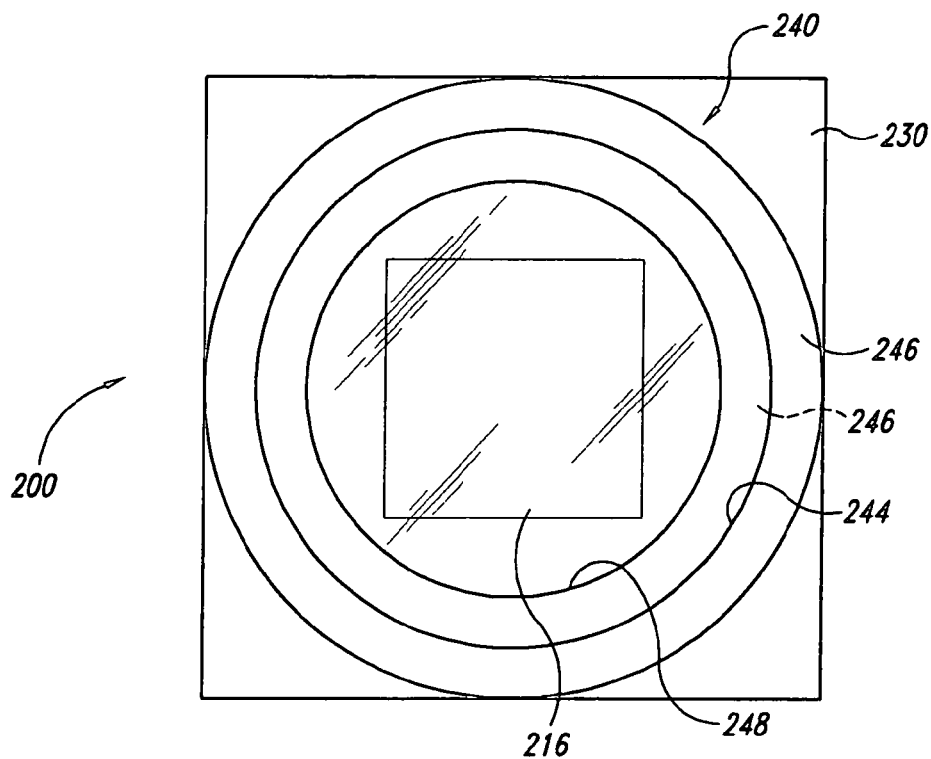

FIG. 2B is a top plan view of the imaging unit 200 shown in FIG. 2A. Referring to FIGS. 2A and 2B together, the imaging unit 200 can further include a first referencing element 240 fixed relative to the image sensor 216 at a predetermined location. In this embodiment, the first referencing element 240 is a first stand-off section defined by a raised feature projecting from the cover 230, but in other embodiments the first referencing elements can be other types of supports. As explained in more detail below, the first referencing element is configured to receive a complementary referencing element of an optics unit in a fixed, preset position to accurately situate a lens or other optic member at a desired location with respect to the image sensor 216.

The embodiment of the first referencing element 240 shown in FIGS. 2A and 2B has a circular shape circumscribing the area above the image sensor 216. The first referencing element 240 can include a first interface feature 242 having a first alignment component 244 and a first stop component 246. The first interface feature 242 can define a first interface area of the first referencing element 240. Referring to FIG. 2A, the first referencing element 240 is configured so that the first alignment component 244 is at a predetermined lateral location from the image sensor 216. For example, the first alignment component 244 can be fixed at a lateral distance $D_L$ from the centerline $C_L$-$C_L$ of the image sensor 216. The lateral distance $D_L$ can be measured with respect to other features of the image sensor 216, such as the edge or a fiducial point, in lieu of or in addition to the centerline $C_L$-$C_L$. The lateral distance $D_L$ of the first alignment component 244 is controlled to within very tight tolerances of approximately 50 µm, and more preferably within approximately 5 µm. The first alignment component 244 can be precisely positioned within such tolerances, or even tighter tolerances (e.g., sub-micron), using three-dimensional stereolithography processes and/or other processes. In other embodiments, the first alignment component 244 can be the outer perimeter surface of the first referencing element 240 or another surface at an oblique angle with respect to the image sensor 216.

The first stop component 246 is also at a predetermined spacing from the image sensor 216. The first stop component 246, for example, is spaced apart from the image sensor 216 by a fixed, preset elevation distance $D_E$. The first stop component 246 provides a fixed surface at a known distance from the image sensor 216 for accurately positioning a lens or other optic member at a desired distance from the image sensor. The first stop component 246 can alternatively be the lower "step" of the first referencing element 240 (identified by broken lead line) in addition to or in lieu of the stop surface 246 shown with a solid lead line.

The first referencing element 240 further includes an opening 248 through which radiation can pass to the image sensor 216. The opening 248 is generally sized so that the first referencing element 240 does not obstruct the image sensor 216, but this is not necessary. In several instances, the opening 248 of the first referencing element 240 is larger than the image sensor 216 to allow more light to reach the image sensor 216. The first referencing element 240, however, is generally not so large that it increases the overall footprint of the imaging unit 200.

The imaging unit 200 shown in FIGS. 2A and 2B is one subassembly of one embodiment of a microelectronic imager in accordance with the invention. The other subassembly of the microelectronic imager is an optics unit configured to interface with the imaging unit 200 in a manner that reliably and accurately aligns an optic member with the image sensor 216 and spaces the optic member apart from the image sensor 216 by a desired distance. One aspect of several embodiments of the imaging unit 200, therefore, is to provide a referencing element that interfaces with the optics unit in only a single position in which an optic member is situated at a desired location relative to the image sensor 216.

Figure 3A:
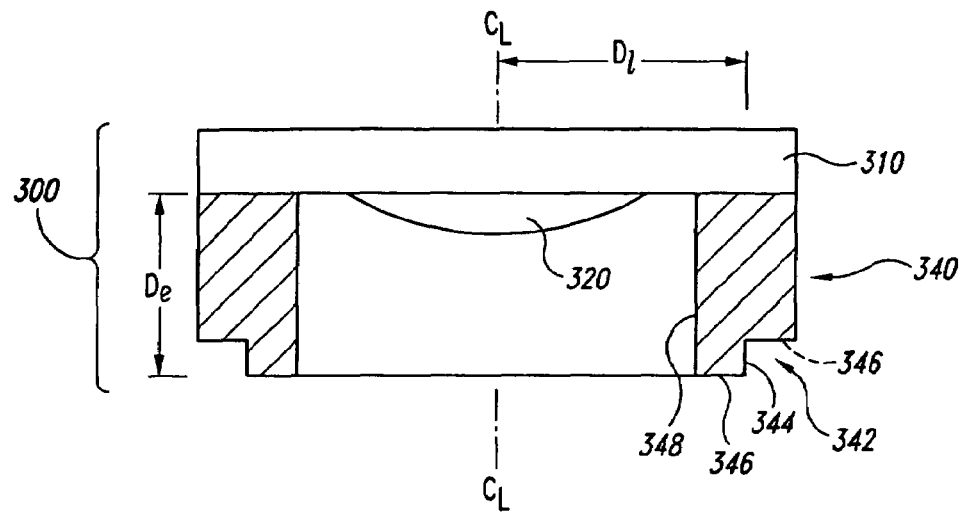
FIG. 3A is a side cross-sectional view and FIG. 3B is a bottom plan view of an optics unit for a microelectronic imager in accordance with an embodiment of the invention.
Figure 3B:
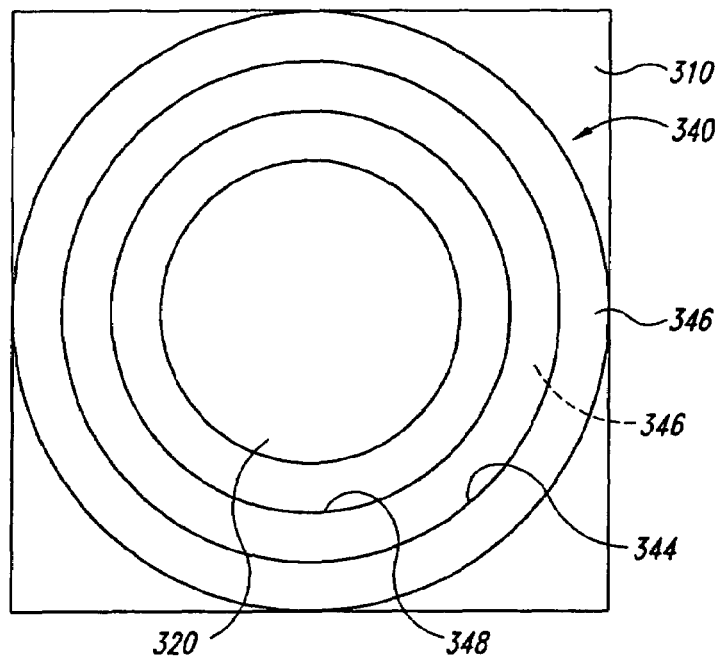

FIG. 3A is a side cross-sectional view and FIG. 3B is a bottom plan view of an optics unit 300 configured to be attached to the imaging unit 200 shown in FIGS. 2A and 2B. In this embodiment, the optics unit 300 includes a substrate 310 and an optic member 320 on the substrate 310. The substrate 310 and the optic member 320 transmit at least the desired spectrum of radiation to the image sensor. The substrate 310 can be glass or quartz, and the substrate 310 can be coated to filter infrared radiation from the visible light spectrum. The optic member 320 can be a lens for focusing the light, a pinhole for reducing higher order refractions, and/or other optical structures for performing other functions.

The optics unit 300 further includes a second referencing element 340 attached to the substrate 310. The second referencing element 340 defines a second stand-off section. The second referencing element 340 includes a second interface feature 342 having a second alignment component 344 and a second stop component 346. The second alignment component 344 is spaced apart from the centerline $C_L$-$C_L$ of the optic member 320 by a predetermined lateral distance $D_l$. The second stop component 346 is spaced apart from the substrate 310 and/or the optic member 320 by a second elevation distance $D_e$. As explained in more detail below with respect to FIG. 4, the second interface feature 342 of the second referencing element 340 is configured to mate or otherwise interface with the first interface feature 242 of the first referencing element 240 shown in FIG. 2A. The second referencing element 340 can also include an opening 348.

Figure 4:
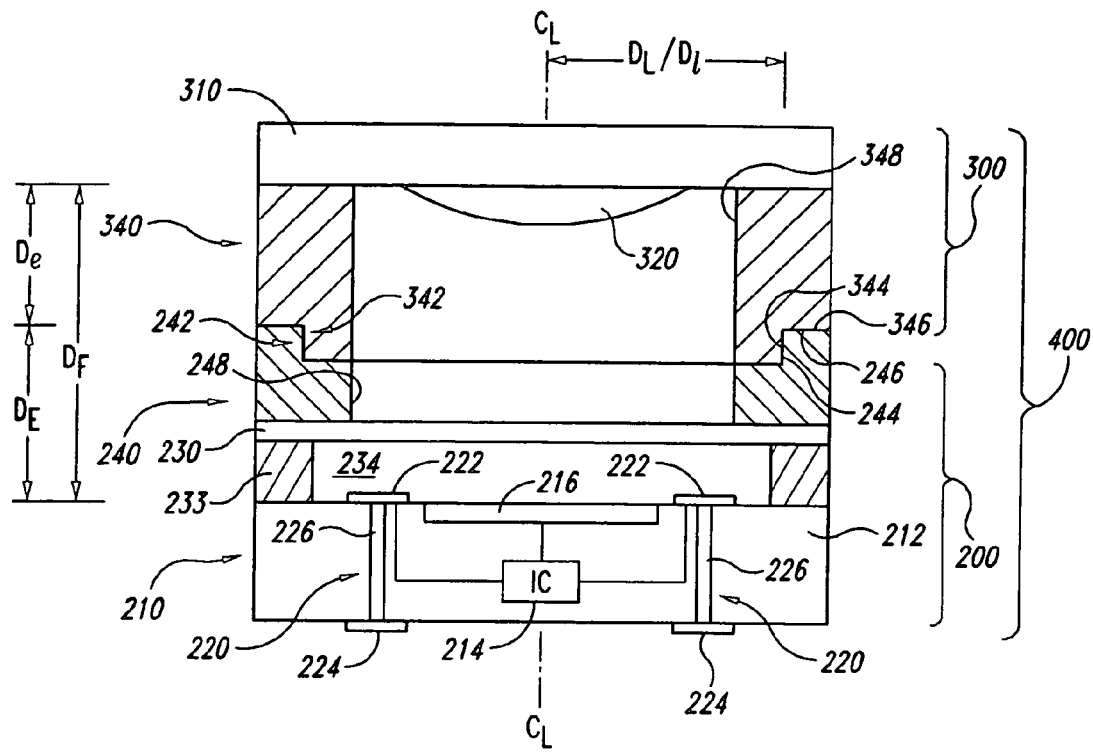
FIG. 4 is a side cross-sectional view of a microelectronic imager with the imaging unit of FIG. 2A and the optics unit of FIG. 3A in accordance with an embodiment of the invention.

FIG. 4 is a side cross-sectional view of a microelectronic imager 400 including the imaging unit 200 of FIG. 2A and the optics unit 300 of FIG. 3A. In this embodiment, the first and second referencing elements 240 and 340 have steps that are seated with each other such that (a) the first alignment component 244 interfaces with the second alignment component 344 and (b) the first stop component 246 interfaces with the second stop component 346. The second referencing element 340 can be secured to the first referencing element 240 along the first and second interface features 242 and 342 using an adhesive (e.g., cyanoacrylate) and/or a welded connection (e.g., ultrasonic or thermal). The interface between the first and second alignment components 244 and 344 can align the centerline of the optic member 320 with the centerline of the image sensor 216. In the embodiment shown in FIG. 4, for example, the lateral offset distance $D_L$ for the first alignment component 244 is at least approximately equal to the lateral offset distance $D_l$ for the second alignment component 344 to align the optic member 320 with the image sensor 216. The interface between the first and second stop components 246 and 346 can similarly space the optic member 320 apart from the image sensor 216 by a desired focal distance $D_F$. The second stop component 346 can accordingly engage or otherwise interface with the first stop component 246 when the sum of the elevation distances $D_E$ and $D_e$ equals the desired focus distance $D_F$.

Several embodiments of the microelectronic imager 400 are expected to significantly improve (a) the accuracy with which the optic member 320 is aligned with the image sensor 216 and/or (b) the accuracy with which the optic member 320 is spaced apart from the image sensor 216 by a desired distance. One aspect of the microelectronic imager 400 is that the first and second referencing elements 240 and 340 can be fabricated using semiconductor processing technologies. This enables the referencing elements to be positioned and configured with very precise dimensions compared to manually installing the optical components in conventional microelectronic imagers. Another aspect of the microelectronic imager 400 is that the first referencing element 240 is keyed with or otherwise seated with the second interface element 340 in a fixed, preset position in which the first and second alignment components 244 and 344 interface with each other and the first and second stop components 246 and 346 interface with each other such that the optic member 320 is inherently situated at a desired position with respect to the image sensor 216. Thus, the embodiment of the microelectronic imager 400 shown in FIG. 4 not only increases the accuracy of aligning and spacing the optic member 320 relative to the image sensor 216, but it also enables smaller and/or higher performance packages because the first and second referencing elements 240 and 340 can be formed precisely to meet very demanding tolerances.

The embodiment of the microelectronic imager 400 shown in FIG. 4 is further expected to improve the efficiency of packaging imagers compared to the conventional imager shown in FIG. 1. First, a plurality of the imaging units 200 and the optics units 300 can be fabricated simultaneously at the wafer level using semiconductor fabrication techniques. Second, the optics unit 300 can be attached to the imaging unit 200 either individually or at the wafer level using automated equipment because the interface between the first and second referencing elements 240 and 340 inherently positions the optic member 320 at the desired position relative to the image sensor 216. The imager 400 accordingly eliminates manually positioning individual lenses with respect to imaging sensors as described above with the conventional imager shown in FIG. 1. Therefore, the structure of the imager 400 enables processes that significantly enhance the throughput and yield of packaging microelectronic imagers.

The embodiment of the microelectronic imager 400 shown in FIG. 4 can also be much smaller than the conventional imager shown in FIG. 1. First, the footprint of the imager 400 can be as small as the size of the die 210 because the die is not mounted to a separate interposer substrate. This is possible because the through-wafer interconnects 226 provide an array of ball-pads 224 on the backside of the die instead of using wire-bonds. Second, the height of the microelectronic imager 400 is also less than with conventional imagers because the imager 400 eliminates the interposer substrate. Therefore, the microelectronic imager 400 is expected to have a smaller footprint and a lower profile than conventional microelectronic imagers, which is particularly advantageous for picture cell phones, PDAs, or other applications where space is limited.

Figure 5:
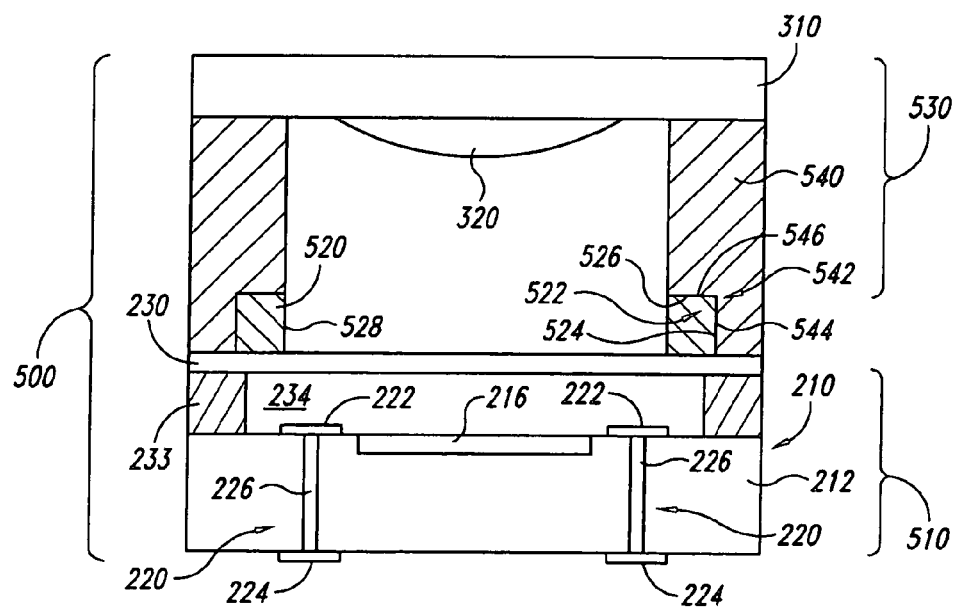
FIG. 5 is a side cross-sectional view of a microelectronic imager in accordance with another embodiment of the invention.

FIG. 5 is a side cross-sectional view of a microelectronic imager 500 in accordance with another embodiment of the invention. The microelectronic imager 500 has several features that are similar to the microelectronic imager 400 shown in FIG. 4; like reference numbers accordingly refer to like components in FIGS. 4 and 5. In this embodiment, the imager 500 has an imaging unit 510 including the die 210 with the image sensor 216 described above. The imaging unit 510 further includes a first referencing element 520 having a first interface feature 522 with a first alignment component 524 and a first stop component 526. The first referencing element 520 can further include an opening 528. The imager 500 further includes an optics unit 530 having a second referencing element 540 including a second interface feature 542 with a second alignment component 544 and a second stop component 546. The primary difference between the imager 500 shown in FIG. 5 and the imager 400 shown in FIG. 4 is that the first referencing element 520 of the imaging unit 510 is simply a footing in which the first alignment component 524 is an outer wall and the first stop component 526 is an upper surface.

The imaging unit 510 and the optics unit 530 are assembled by engaging the first referencing element 520 with the second referencing element 540 so that the first interface feature 522 is seated with the second interface feature 542. As explained above with respect to the imager 400, the alignment components 524 and 544 align the optic member 320 with the image sensor 216, and the stop components 526 and 546 space the optic member 320 apart from the image sensor 216 by desired distance. The imager 500, therefore, is expected to have many of the same advantages as the imager 400.

Figure 6:
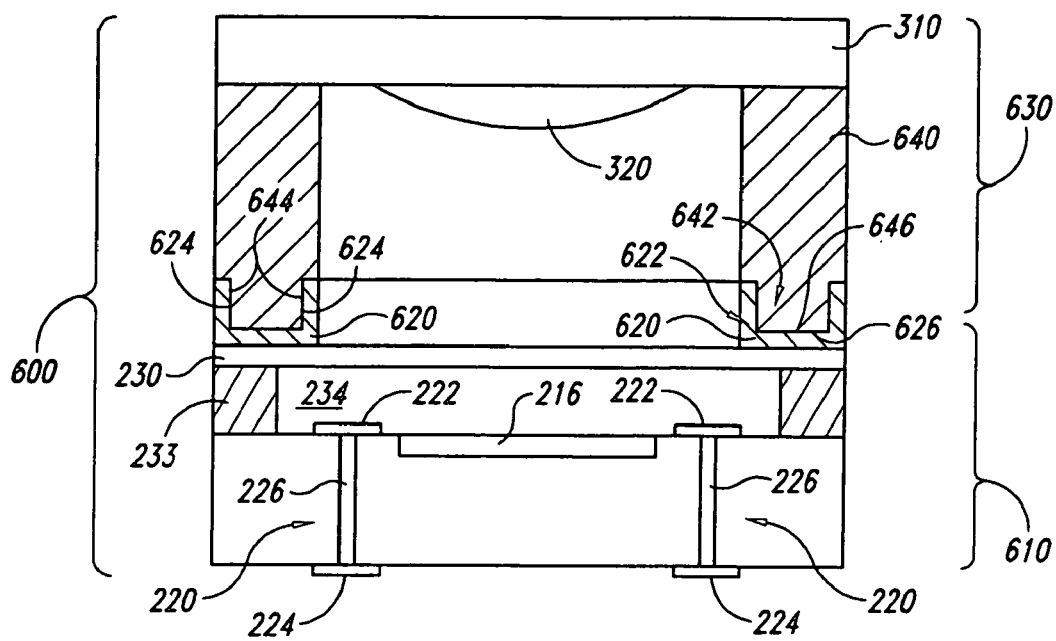
FIG. 6 is a side cross-sectional view of a microelectronic imager in accordance with another embodiment of the invention.

FIG. 6 is a schematic cross-sectional view of a microelectronic imager 600 in accordance with another embodiment of the invention. In this embodiment, the imager 600 has several components that are similar to the imagers 400 and 500; like reference numbers accordingly refer to like components in FIGS. 4-6. The imager 600 can include an imaging unit 610 having a first referencing element 620 with a first interface feature 622. In this embodiment, the first interface feature 622 is a U-shaped channel having a first alignment component 624 defined by the inner side walls of the channel and a first stop component 626 defined by a floor of the channel. The imager 600 can further include an optics unit 630 having a second referencing element 640 including a second interface feature 642. The second interface feature 642 can include a second alignment component 644 configured to mate or otherwise interface with the first alignment component 624 and a second stop component 646 configured to mate or otherwise interface with the first stop component 626. The imager 600 operates similarly to the imagers 400 and 500.

Figure 7:
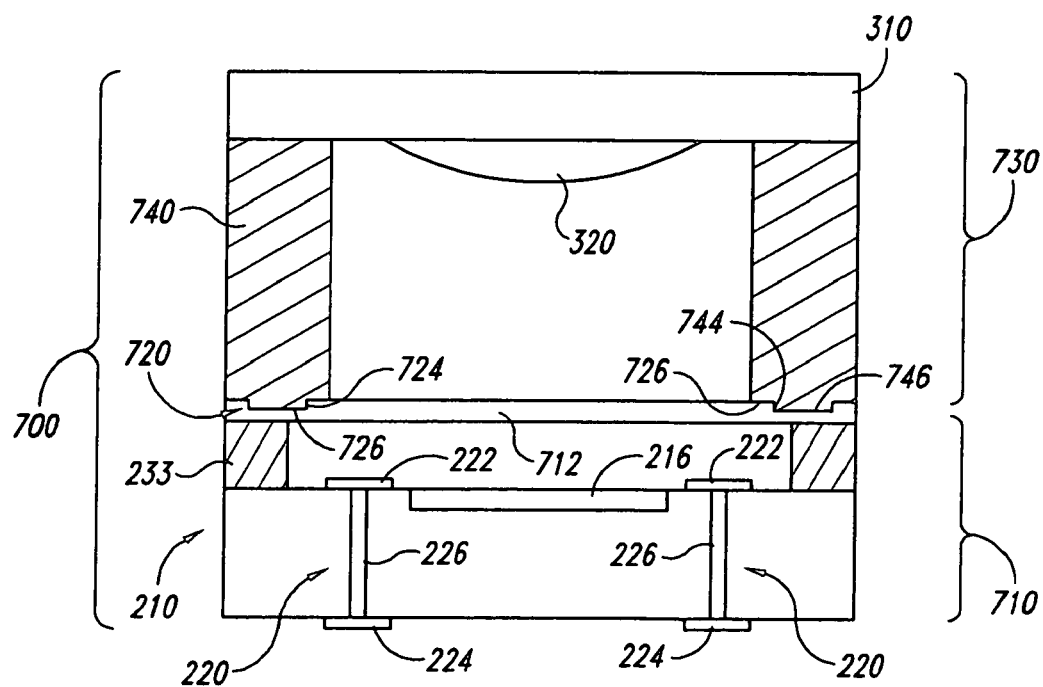
FIG. 7 is a side cross-sectional view of a microelectronic imager in accordance with another embodiment of the invention.

FIG. 7 is a side cross-sectional view of an imager 700 in accordance with yet another embodiment of the invention. In this embodiment, the imager 700 includes an imaging unit 710 and an optics unit 730 attached to the imaging unit 710. The imaging unit 710 includes the die 210 and a cover 712 over the die 210. The imaging unit 710 further includes a first referencing element 720 defined by a depression in the cover 712. The first referencing element 720 can be a groove, trench, hole, or other structure projecting into the cover 712. The first referencing element 720 includes a first alignment component 724 defined by a side wall of the depression and a first stop component 726 defined by either the upper surface of the cover 712 and/or a lower surface of the depression. The optics unit 730 can include a second referencing element 740 having a second alignment component 744 and a second stop component 746 configured to engage the first alignment component 724 and the first stop component 726, respectively. For example, the distal portion of the second referencing element 740 can be configured to mate with the depression in the cover 712 to situate the optic member 320 at a desired position relative to the image sensor 216.

Figure 8:
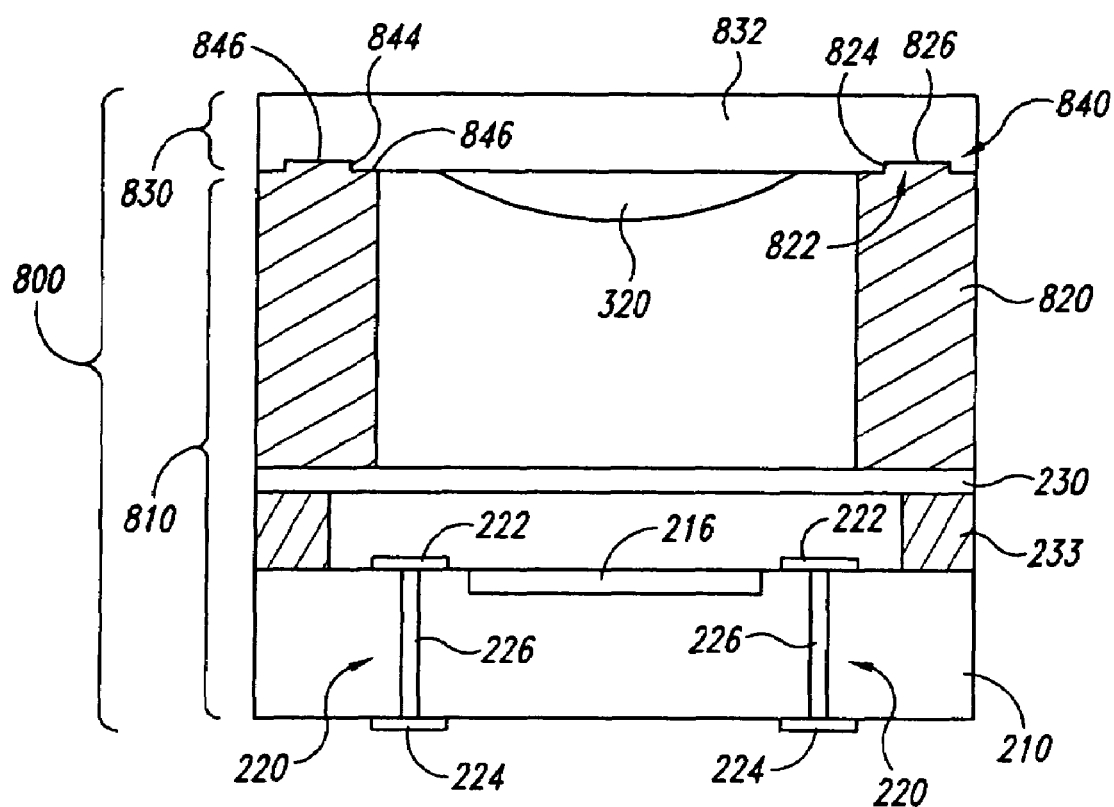
FIG. 8 is a side cross-sectional view of a microelectronic imager in accordance with another embodiment of the invention.

FIG. 8 is a side cross-sectional view of an imager 800 having an imaging unit 810 and an optics unit 830 in accordance with another embodiment of the invention that is similar to the imager 700 of FIG. 7. The imaging unit 810 can include the die 210, the image sensor 216, the cover 230, and a first referencing element 820 on the cover 230. The first referencing element 820 includes a first interface feature 822 having a first alignment component 824 and a first stop component 826 defined by a distal projection of the first referencing element 820. The optics unit 830 includes a substrate 832 and the optic member 320 attached to the substrate 832. The optics unit 830 further includes a second referencing element 840 defined by a trench, groove or other depression in the substrate 832. The second referencing element 840, more specifically, includes a second alignment component 844 configured to engage the first alignment component 824 and a second stop component 846 configured to engage the first stop component 826 to situate the optic member 320.

Figure 9A:
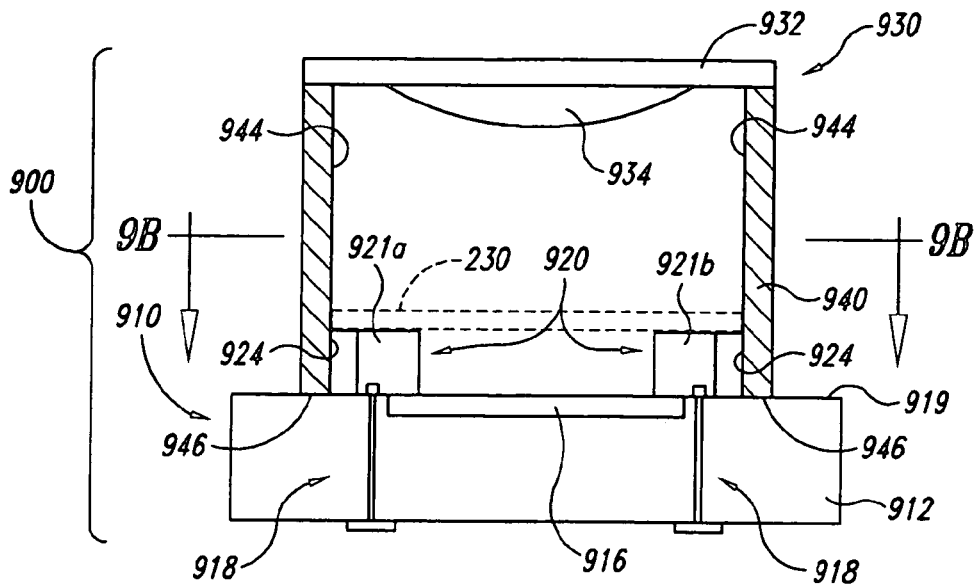
FIG. 9A is a side cross-sectional view and FIG. 9B is a schematic top cross-sectional view of a microelectronic imager in accordance with an embodiment of the invention.
Figure 9B:
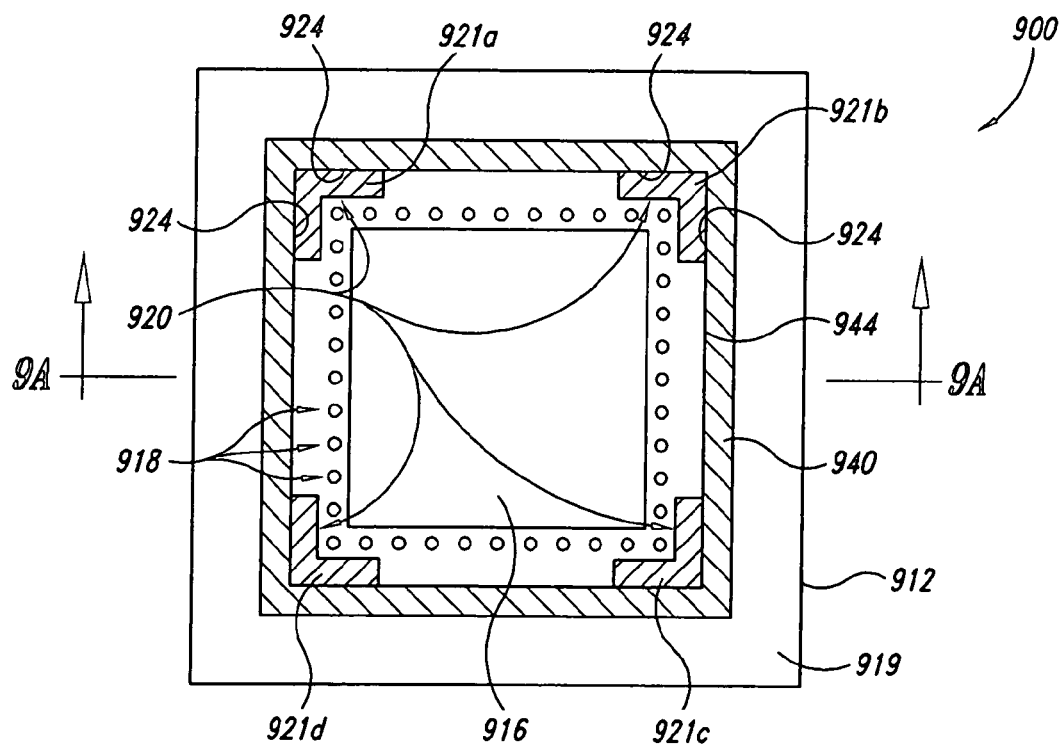

FIG. 9A is a side cross-sectional view and FIG. 9B is a top cross-sectional view of a microelectronic imager 900 in accordance with another embodiment of the invention. More specifically, FIG. 9A is a cross-sectional view taken along line 9A-9A of FIG. 9B, and FIG. 9B is a cross-sectional view taken along line 9B-9B of FIG. 9A. In this embodiment, the microelectronic imager 900 includes an imaging unit 910 (FIG. 9A) having a die 912, an image sensor 916 on the die 912, and a plurality of external contacts 918 operatively coupled to the image sensor 916. The image sensor 916 and the external contacts 918 can be similar to the image sensor 216 and external contacts 220 described above with reference to FIG. 2A. The die 912 can further include an active upper surface 919.

The imaging unit 910 can further include a first referencing element 920 having one or more guides 921a-d (only 921a-b shown FIG. 9A). Referring to FIG. 9A, the guides 921a-b project directly from the upper surface 919 of the die 912 instead of projecting from a cover over the image sensor as shown in FIG. 2A. In other embodiments, however, the guides 921a-d can project from the cover 230 (shown in phantom) over the image sensor 916 instead of the die 912. Referring to FIG. 9B, the first referencing element 920 has first alignment components 924 at predetermined lateral distances from the image sensor 916. The first alignment components 924 in the embodiment shown in FIG. 9B are perpendicular surfaces on each of the guides 921a-d. The first alignment components 924 can have other embodiments with other shapes that are at a predetermined lateral distance from the image sensor 916.

The imager 900 can also include an optics unit 930 having a substrate 932 (FIG. 9A), an optic member 934 (FIG. 9A) carried by the substrate 932, and a second referencing element 940 attached to the substrate 932. The substrate 932 and the optic member 934 can be similar to those described above with reference to FIGS. 2A-8. The second referencing element 940 includes a second alignment component 944 configured to seat with the first alignment components 924 of the first referencing element 920 to align the optic member 934 with the image sensor 916. The second referencing element 940 further includes a stop component 946 (FIG. 9A) contacting the upper surface 919 of the die 912. The second referencing element 940 accordingly has a fixed, predetermined height to set the desired spacing between the optic member 934 and the image sensor 916.

The microelectronic imager 900 can be formed by constructing the guides 921a-d directly on the die 912 at the wafer level before singulating the die 912. The optics unit 930 can then be mounted to the die 912 either at the wafer level or after singulation. The optics unit 930, for example, can be mounted to the die 912 by aligning the first alignment components 924 with the second alignment component 944 and moving the die 912 and/or the optics unit 930 until the first stop component 946 engages the upper surface 919 of the die 912.

Figure 10A:
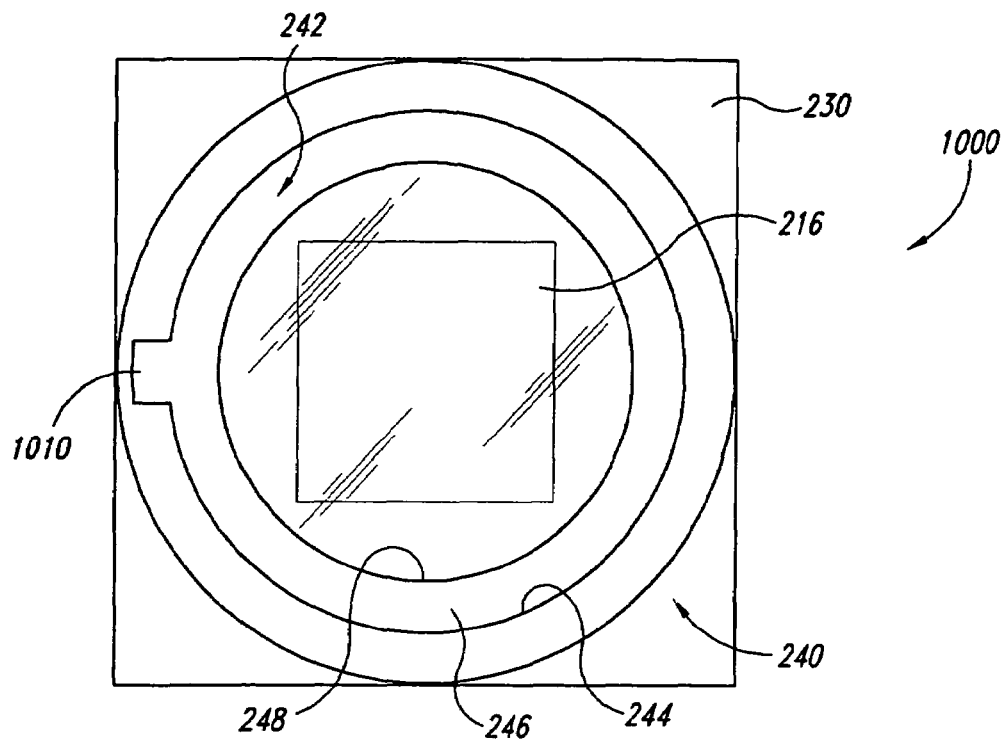
FIG. 10A is a top plan view of an imaging unit and FIG. 10B is a side elevation view of an optics unit in accordance with another embodiment of the invention.
Figure 10B:
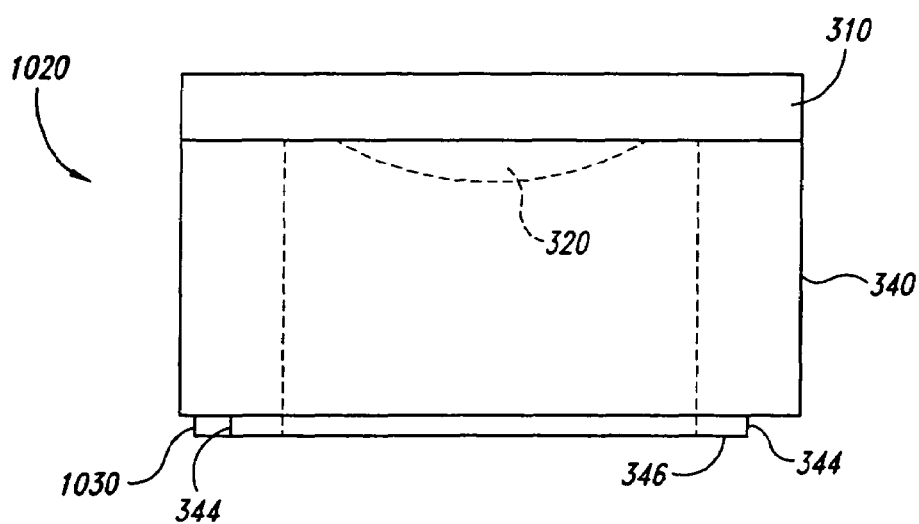

FIG. 10A is a top plan view of an imaging unit 1000 and FIG. 10B is a side elevation view of an optics unit 1020 that can be assembled together to form a microelectronic imager in accordance with yet another embodiment of the invention. The imaging unit 1000 is similar to the imaging unit 200 shown in FIG. 2B, and the optics unit 1020 is similar to the optics unit 300 shown in FIG. 3A. Like reference numbers accordingly refer to like components in FIGS. 2B, 3A, 10A and 10B. The difference between the imaging unit 1000 shown in FIG. 10A and the imaging unit 200 shown in FIG. 2B is that the imaging unit 1000 has a first radial alignment component 1010 in the first referencing element 240. The first radial alignment component 1010 can be a notch formed into the first interface feature 242. The optics unit 1020 is different than the optics unit 300 shown in FIG. 3A in that the optics unit 1020 includes a second radial alignment component 1030 configured to be received in the first radial alignment component 1010. The second radial alignment component 1030, for example, can be a key or tab. In operation, the optics unit 1020 is attached to the imaging unit 1000 by aligning the second radial alignment component 1030 with the first radial alignment component 1010 and moving the optics unit 1020 downward until the first and second stop components 246 and 346 engage each other. The interface between the first and second alignment components 244 and 344 laterally aligns the optic member 320 over the image sensor 216, and the interface between the first and second radial alignment components 1010 and 1030 radially aligns the optic member 320 with the image sensor 216. Moreover, the first and second stop components 246 and 346 space the optic member 320 apart from the image sensor 216 by the desired distance. The imaging unit 1000 and the optics unit 1020 accordingly provide an additional degree of alignment between the optic member and the image sensor.

FIG. 11 is a side cross-sectional view of a microelectronic imager 1100 in accordance with another embodiment of the invention. Like reference numbers refer to like components in FIGS. 4 and 11. The microelectronic imager 1100 can include an imaging unit 1110 and an optics unit 1120. The imaging unit 1110 can include a first referencing element 1112 having a first interface feature 1114. In this embodiment, the first interface feature 1114 includes inclined surfaces 1116a and 1116b that intersect at an apex 1118. The optics unit 1120 can include a second referencing element 1122 including a second interface feature 1124 having inclined surfaces 1126a and 1126b. The first interface feature 1114 seats with the second interface feature 1124 to position the first and second referencing elements 1112 and 1122 in a configuration in which the optic member 320 is (a) aligned with the image sensor 216 and (b) spaced apart from the image sensor 216 by a desired distance. The inclined surfaces of the first and second referencing elements 1112 and 1122 inherently guide the optics unit 1120 into alignment with the imaging unit 1110. The imaging unit 1110 and the optics unit 1120 are accordingly expected to provide additional advantages for automated assembly of microelectronic imagers because the optics unit 1120 can initially be slightly offset as it is lowered onto the imaging unit 1110.

FIG. 12 is a schematic cross-sectional view of an assembly 1200 including a plurality of microelectronic imagers that each have an imaging unit and an optics unit. The assembly 1200 includes a microelectronic workpiece 1202 having a first substrate 1204 and a plurality of imaging units 1210 formed on the first substrate 1204. Individual imaging units 1210 can include an image sensor 1216, external contacts 1218 electrically coupled to the image sensor 1216, and a first referencing element 1220. The first referencing elements 1220 can be similar to the first referencing element 240 shown in FIG. 2A or any other first referencing element described above. The first referencing elements 1220 can be formed directly onto the first substrate 1204 or on covers over the individual image sensors (see FIG. 2A). The first referencing elements 1220 can be formed at the wafer level using stereolithography apparatus and processes available from 3D Systems, Inc. of Valencia, Calif., as described in U.S. Pat. Nos. 4,575,330; 4,929,402; 4,996,010; 4,999,143; 5,015,424; 5,058,988; 5,059,021; 5,096,530; 5,104,592; 5,123,734; 5,130,064; 5,133,987; 5,141,680; 5,143,663; 5,164,128; 5,174,931; 5,174,943; 5,182,055; 5,182,056; 5,182,715; 5,184,307; 5,192,469; 5,192,559; 5,209,878; 5,234,636; 5,236,637; 5,238,639; 5,248,456; 5,256,340; 5,258,146; 5,267,013; 5,273,691; 5,321,622; 5,344,298; 5,345,391; 5,358,673; 5,447,822; 5,481,470; 5,495,328; 5,501,824; 5,554,336; 5,556,590; 5,569,349; 5,569,431; 5,571,471; 5,573,722; 5,609,812; 5,609,813; 5,610,824; 5,630,981; 5,637,169; 5,651,934; 5,667,820; 5,672,312; 5,676,904; 5,688,464; 5,693,144; 5,695,707; 5,711,911; 5,776,409; 5,779,967; 5,814,265; 5,840,239; 5,854,748; 5,855,718; and 5,855,836. The disclosures of each of the foregoing patents is incorporated herein by reference.

The optics workpiece 1230 can include a second substrate 1234 and a plurality of optics units 1240 on the second substrate 1234. Individual optics units 1240 can include an optic member 1250 and a second referencing element 1260. The second referencing elements 1260 can be similar to the second referencing element 340 shown in FIG. 3A or any other second referencing element described above. The second referencing elements 1260 can be formed on the second substrate 1234 at the wafer level using similar stereolithography processes and devices available from 3D Systems. As explained above, the first and second referencing elements 1220 and 1260 are configured to be keyed together or otherwise seat with each other in a manner that aligns individual optic members 1250 with corresponding image sensors 1216. The first and second referencing elements 1220 and 1260 are also configured to space the individual optic members 1250 apart from corresponding image sensors 1216 by a desired distance.

The imagers can be assembled by seating individual first referencing elements 1220 with corresponding second referencing elements 1260. In one embodiment, the first and second referencing elements 1220 and 1260 are seated together before cutting the first substrate 1204 or the second substrate 1234 such that all of the microelectronic imagers are assembled at the wafer level. Both of the first and second substrates 1204 and 1234 can then be cut along lines A-A and B-B to separate individual imagers from each other. In a different embodiment, the individual microelectronic imagers are formed by cutting the second substrate 1234 along lines B-B to singulate the individual optics units 1240, attaching the individual optics units 1240 to corresponding imaging units 1210 before cutting the first substrate 1204, and then cutting the first substrate 1204 along lines A-A to singulate individual imagers. In still another embodiment, the first substrate 1204 can be cut along lines A-A to singulate the imaging units 1210, and only the known good imaging units 1210 are then mounted to corresponding optics units 1240 either before or after singulating the second substrate 1234 along lines B-B.

The foregoing processes for assembling imagers are generally performed using automated processing equipment that can accurately cut the workpieces and assemble the optics units with the imaging units without human intervention. This is expected to significantly improve the throughput and quality control of manufacturing microelectronic imagers. The precise wafer-level formation of referencing elements that accurately position the optic members relative to the image sensors enables such automated wafer-level production of high performance digital image sensors. As such, several aspects of microelectronic imagers in accordance with the invention provide a significant improvement in packaging microelectronic imagers.

From the foregoing, it will be appreciated that specific embodiments of the invention have been described herein for purposes of illustration, but that various modifications may be made without deviating from the spirit and scope of the invention. For example, the first and second referencing elements can have any combination of the various features described above with reference to FIGS. 2A-12. Moreover, many embodiments describe engaging the first and second alignment/stop components with each other to mean contacting or otherwise juxtaposing the components with each other either with or without an adhesive between the first and second alignment/stop components. Accordingly, the invention is not limited except as by the appended claims.

We claim:

1. A microelectronic imager, comprising:
 an imaging unit including a microelectronic die with an image sensor and a first referencing element fixed to the imaging unit, wherein the first referencing element comprises a first alignment component for horizontal alignment and a first stop component for vertical alignment, the first alignment and first stop components being at a first reference location relative to the image sensor on the die; and an optics unit having an optic member and a second referencing element fixed to the optics unit, wherein the second referencing element comprises a second alignment component for horizontal alignment and a second stop component for vertical alignment, the second alignment and second stop components being at a second reference location relative to the optic member and the second referencing element being seated and in direct contact with the first referencing element at a fixed, preset position in which the optic member is situated at a desired location relative to the image sensor, wherein the entirety of the optics unit is within a vertical periphery of the first alignment component.

2. The imager of claim 1 wherein the first referencing element comprises a first support on the die around the image sensor and the second referencing element comprises a second support on the optics unit around the optic member, and the first support on the die is mated with the second support on the optics unit.

3. The imager of claim 1 wherein:
the imaging unit further comprises a cover over the image sensor; and
the first referencing element comprises a first support on the cover and the second referencing element comprises a second support on the optics unit around the optic member, and the first support on the cover is mated with the second support on the optics unit.

4. The imager of claim 1 wherein the first referencing element comprises a first support having a first step and the second referencing element comprises a second support having a second step mated with the first step of the first support.

5. A microelectronic imager, comprising:
a microelectronic die having an image sensor and a plurality of contacts electrically coupled to the image sensor;
a first referencing element fixed relative to the die, the first referencing element having a first alignment component at a lateral distance from the image sensor and a first stop component spaced apart from the image sensor along an axis normal to the image sensor by separation distance;
an optics unit having an optic member; and
a second referencing element connected to the optics unit, the second referencing element having a second alignment component engaged with the first alignment component to align the optic member with the image sensor and a second stop component engaged with the first stop component to space the optic member apart from the image sensor by a desired distance, wherein the first alignment component is located entirely within an innermost vertical periphery of the second alignment component.

6. The imager of claim 5 wherein:
the first referencing element comprises a first support projecting from one of the die or a cover over the die, and the first support includes the first alignment component and the first stop component; and
the second referencing element comprises a second support projecting from the optics unit, and the second support includes the second alignment component and the second stop component.

7. The imager of claim 5 wherein the first referencing element comprises a first support having a first step and the second referencing element comprises a second support having a second step mated with the first step of the first support.

8. A microelectronic imager, comprising:
an imaging unit including (a) a microelectronic die having an image sensor and a plurality of external contacts electrically connected to the image sensor, (b) a cover mounted above the microelectronic die, and (c) a first referencing element adjacent to the cover, wherein the first referencing element is adjacent to a top side of the cover and the microelectronic die is attached to a bottom side of the cover; and
an optics unit including an optic member and a second referencing element adjacent to the optics unit and seated and in direct contact with the first referencing element, the first and second referencing elements being configured to align the optic member with the image sensor and space the optic member apart from the image sensor by a desired distance when the first and second referencing elements are seated together.

9. The imager of claim 8 wherein:
the first referencing element has a first interface feature at a first reference location relative to the image sensor on the die;
the second referencing element has a second interface feature at a second reference location relative to the optic member; and
the first interface feature is engaged with the second interface feature with the first reference location coinciding with the second reference location whereby the optic member is aligned with the image sensor and positioned at a desired distance from the image sensor.

10. The imager of claim 8 wherein:
the first referencing element comprises a first support projecting from the cover, the first support having a first alignment component at a preset lateral location from the image sensor and a first stop component at a fixed, preset elevation from the image sensor; and
the second referencing element comprises a second support fixed to the optics unit, the second support having (a) a second alignment component juxtaposed to the first alignment component to align the optic member with a centerline of the image sensor, and (b) a second stop component juxtaposed to the first stop component to space the optic member apart from the image sensor by a desired distance.

11. The imager of claim 8 wherein the first referencing element comprises a first support on the cover around the image sensor and the second referencing element comprises a second support on the optics unit around the optic member, and the first support on the cover is mated with the second support on the optics unit.

12. The imager of claim 8 wherein the first referencing element comprises a first support having a first step and the second referencing element comprises a second support having a second step mated with the first step of the first support.

13. A microelectronic imager, comprising:
an imaging unit including (a) a microelectronic die with an image sensor and a plurality of external contacts electrically coupled to the image sensor, and (b) a cover attached by a lower surface of the cover to an upper surface of the microelectronic die, wherein the cover comprises a first interface area at a set reference position relative to the image sensor; and
an optics unit having an optic member and a first stand-off section adjacent to the optics unit, the first stand-off section having a second interface area at a set reference position relative to the optic member, and the first interface area being seated with the second interface area to connect the cover with the first stand-off section in a configuration in which the optic member is at a desired location relative to the image sensor.

14. The imager of claim 13 wherein: the first interface area has a first alignment component at a preset lateral location from the image sensor and a first stop component at a fixed, preset elevation from the image sensor; and the first stand-off section projects from the optics unit, and the second interface area has (a) a second alignment component juxtaposed to the first alignment component to align the optic member with a centerline of the image sensor, and (b) a second stop component juxtaposed to the first stop component to space the optic member apart from the image sensor by a desired distance.

15. The imager of claim 13, further comprising a second stand-off section wherein the second stand-off section projects from the die to the cover and extends around the image sensor and the first stand-off section projects from the optics unit and extends around the optic member, and the first interface area is mated with the second interface area.

16. The imager of claim 13 wherein the first interface area comprises a first step and the second interface area comprises a second step mated with the first step.

17. A method of packaging an imager, comprising:
providing an imaging unit having (a) a microelectronic die with an image sensor and a plurality of external contacts electrically coupled to the image sensor, (b) a first stand-off adjacent to an upper surface of the die, (c) a cover adjacent to an upper surface of the first stand-off, and (d) a first referencing element adjacent to an upper surface of to the cover and having a first interface feature at a set reference position relative to the image sensor;

providing an optics unit having an optic member and a second referencing element fixed to the optics unit, the second referencing element having a second interface feature at a set reference position relative to the optic member; and attaching the second referencing element to the first referencing element by seating the second interface feature with the first interface feature in a predetermined position in which the optic member is at a desired location relative to the image sensor.

18. The method of claim 17 wherein the first referencing element comprises a first support having a first step and the second referencing element comprises a second support having a second step, and wherein attaching the first referencing element to the second referencing element comprises mating the first step of the first support with the second step of the second support.

* * * * *

UNITED STATES PATENT AND TRADEMARK OFFICE
CERTIFICATE OF CORRECTION

PATENT NO. : 7,583,862 B2  Page 1 of 1
APPLICATION NO. : 10/723363
DATED : September 1, 2009
INVENTOR(S) : Tuttle et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1678 days.

Signed and Sealed this

Fourteenth Day of September, 2010

David J. Kappos
*Director of the United States Patent and Trademark Office*